United States Patent
Zhang et al.

(10) Patent No.: US 7,951,680 B2
(45) Date of Patent: May 31, 2011

(54) INTEGRATED CIRCUIT SYSTEM EMPLOYING AN ELEVATED DRAIN

(75) Inventors: Guowei Zhang, Singapore (SG); Yisuo Li, Singapore (SG); Ming Li, Singapore (SG); Purakh Raj Verma, Singapore (SG); Shao-fu Sanford Chu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 90 days.

(21) Appl. No.: 12/262,120

(22) Filed: Oct. 30, 2008

(65) Prior Publication Data

US 2010/0109097 A1      May 6, 2010

(51) Int. Cl.
*H01L 21/336* (2006.01)

(52) U.S. Cl. ............ 438/300; 257/E21.43; 257/E21.634

(58) Field of Classification Search .................. 438/222, 438/226, 262, 269, 300, 358, 360, 363; 257/E29.012, E29.268
See application file for complete search history.

(56) References Cited

U.S. PATENT DOCUMENTS

| | | | |
|---|---|---|---|
| 6,034,415 A * | 3/2000 | Johnson et al. | 257/621 |
| 6,153,905 A | 11/2000 | Davies et al. | |
| 6,620,688 B2 * | 9/2003 | Woo et al. | 438/262 |
| 7,151,296 B2 | 12/2006 | Wu et al. | |
| 2008/0093667 A1 | 4/2008 | Shibib et al. | |

* cited by examiner

*Primary Examiner* — Brook Kebede
(74) *Attorney, Agent, or Firm* — Mikio Ishimaru

(57) ABSTRACT

A method for manufacturing an integrated circuit system that includes: providing a substrate including an active device; forming a drift region in the substrate, the drift region bounded in part by a top surface of the substrate and spaced apart from a source; and forming a drain above the drift region.

20 Claims, 3 Drawing Sheets

US 7,951,680 B2

INTEGRATED CIRCUIT SYSTEM EMPLOYING AN ELEVATED DRAIN

TECHNICAL FIELD

The present invention relates generally to integrated circuits, and more particularly to an integrated circuit system employing an elevated drain.

BACKGROUND ART

Integrated circuits are used in many portable electronic products, such as cell phones, portable computers, voice recorders, etc., as well as in many larger electronic systems, such as cars, planes, industrial control systems, etc. Integrated circuits may include a combination of active devices, passive devices and their interconnections.

Active devices are typically comprised by metal-oxide-semiconductor field-effect transistor (MOSFET) devices, which generally include a semiconductor substrate, having a source, a drain, and a channel located between the source and drain. A gate stack composed of a conductive material (i.e., a gate) and an oxide layer (i.e., a gate oxide) are typically located directly above the channel. During operation, an inversion layer forms a conducting bridge or "channel" between the source and drain when a voltage is applied to the gate. But as MOSFET devices are adapted for higher voltage applications, problems arise with respect to current and voltage output characteristics for these traditional MOSFET devices.

Accordingly, the semiconductor industry developed lateral diffused metal-oxide semiconductor (LDMOS) structures to help ameliorate some of these problems. For example, LDMOS structures solved some of these problems by altering (i.e., by increasing) the length of the drift region, thereby suppressing the shift in the peak electric field to the highly doped drain regions, which can cause an unwanted increase in the substrate current. It will be appreciated by those skilled in the art that unacceptably high substrate current levels can degrade a device's safe operation region.

However, forming an LDMOS structure with a longer/wider drift region will consume more substrate area and create a larger device, which is in direct opposition to the central tenet of modern day semiconductor manufacturing (i.e., decreasing the size of a device). Moreover, a longer/wider drift region can also increase the parasitic capacitance and the on-state resistance ($R_{on}$) of the LDMOS device, two conditions which may affect high frequency performance and operating speed of the device. With power MOSFET's finding increasing use in portable electronics and wireless applications, where battery power is at a premium, the trend is understandably toward lower values of $R_{on}$.

Thus, a need still remains for a reliable integrated circuit system and method of fabrication, wherein the integrated circuit system exhibits a reduced substrate current, a lower parasitic capacitance, and/or a lower on-state resistance. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit system including: providing a substrate including an active device; forming a drift region in the substrate, the drift region bounded in part by a top surface of the substrate and spaced apart from a source; and forming a drain above the drift region.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
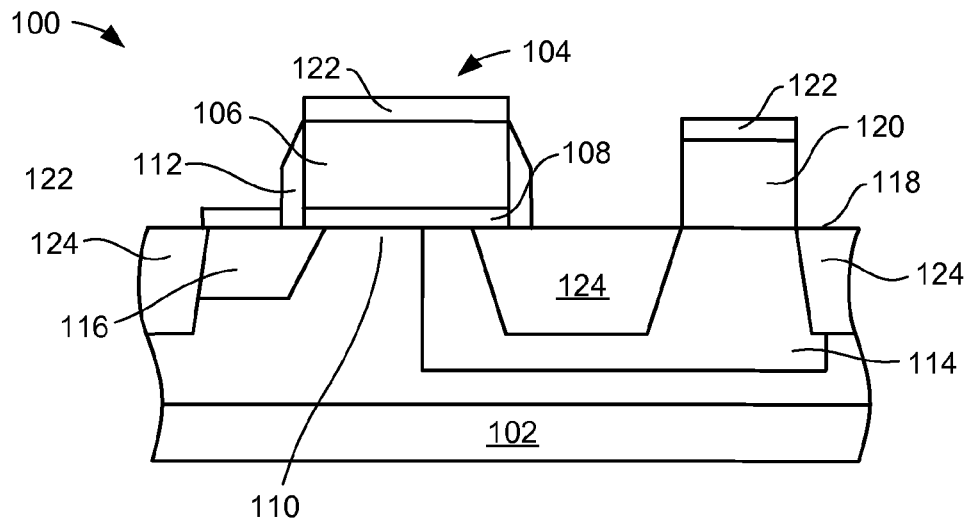
FIG. 1 is a partial cross sectional view of an integrated circuit system in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGS. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The term "layer" encompasses both the singular and the plural unless otherwise indicated.

The terms "first", "second", and "third" as used herein are for purposes of differentiation between elements only and are not to be construed as limiting the scope of the present invention.

The term "system" as used herein means and refers to the method and to the apparatus of the present invention in accordance with the context in which the term is used.

Generally, the following embodiments relate to the formation of an integrated circuit system including, but not limited to, an active device structure, such as an LDMOS device, with a strategically engineered drift region and drain region that reduces substrate current, parasitic capacitance, and/or on-state resistance ($R_{on}$), while permitting a reduction in the pitch between adjacent devices.

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices (e.g., active device structures) in which the current flowing between two specified electrodes is controlled or modulated by the voltage applied at a control electrode. Exemplary illustrations may include a bipolar junction transistor (BJT), an n-channel metal-oxide semiconductor (NMOS), a p-channel metal-oxide semiconductor (PMOS), a complementary metal-oxide semiconductor (CMOS) configuration, a single-gate transistor, a multi-gate transistor, a fin-field effect transistor (fin-FET), or an annular gate transistor. Furthermore, it is to be understood that one or more of the integrated circuit system could be prepared at one time on a medium, which could be separated into individual or multiple integrated circuit assemblies at a later stage of fabrication.

Furthermore, although some of the present embodiments will be described herein in the context of an NMOS device, it will be appreciated by those skilled in the art that a PMOS device could be formed by simply substituting opposite polarities to those given for the NMOS embodiments, and that the techniques and aspects of the present embodiments will similarly apply to the alternative embodiment.

Moreover, it will be appreciated by those skilled in the art that the techniques of the present embodiments can be used to fabricate an integrated circuit system, for example, an LDMOS device, using existing conventional NMOS, PMOS, and CMOS compatible process technology, thereby minimizing or reducing the cost of manufacturing.

Moreover, it is to be understood that the integrated circuit system manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

Referring now to FIG. 1, therein is shown a partial cross sectional view of an integrated circuit system 100 in accordance with an embodiment of the present invention.

In some embodiments, the integrated circuit system 100 may include a substrate 102, such as a two hundred (200) mm or three hundred (300) mm semiconductor wafer upon which any number of active and/or passive device structures and their interconnections could be formed. In such cases, a multitude of different regions (e.g., memory, logic, high voltage, etc.) can be formed over, on and/or within the substrate 102 for the manufacture of active and/or passive device structures by conventional deposition, patterning, photolithography, and etching techniques known in the semiconductor processing industry.

In general, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, epitaxial layers, strained configurations, and one or more crystalline orientations (e.g., <100>, <110>, and/or <111> orientations), which may be strategically employed to optimize carrier mobility within NMOS and/or PMOS devices. The substrate 102 may also include any material that becomes amorphous upon implantation.

In some embodiments, the substrate 102 may possess a thickness ranging from about one hundred (100) nanometers to about several hundred microns, for example.

However, the examples provided for the substrate 102 are not to be construed as limiting and the composition of the substrate 102 may include any surface, material, configuration, or thickness that physically and electrically enables the formation of active and/or passive device structures.

Additionally, prior to forming any subsequent layers over the substrate 102, it is to be understood that the substrate 102 may undergo a cleaning step to remove surface contaminants, such as particles, mobile ionic contaminants, organics and native oxides.

In some embodiments, the integrated circuit system 100 may include an active device 104. In such cases, the active device 104 may more particularly include NMOS devices, PMOS devices and/or a combination thereof (e.g., CMOS devices), for example. However, it is to be understood that the active device 104 is not limited to the preceding examples and may include any number of multi-electrode devices in which the current flowing between two specified electrodes is controlled or modulated by the voltage applied at a control electrode.

In general, the active device 104 includes a gate 106, a gate dielectric 108, a channel 110, a spacer 112, a drift region 114, a source 116, a top surface 118, a drain 120, an electrical contact 122, and an isolation structure 124.

In some embodiments, the gate 106 may be formed from conventional materials including doped and undoped semiconducting materials (such as, for example, crystalline Si, polySi, amorphous Si, or SiGe), a metal, a metallic alloy, a silicide, or a combination thereof, for example. The gate dielectric 108 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 108 is not limited to the above examples; for example, the gate dielectric 108 may include any material that permits induction of a charge in the channel 110 when an appropriate voltage is applied to the gate 106. Accordingly, other materials, which may be known to those skilled in the art for gate structures, may also be used for the gate 106 and the gate dielectric 108.

Generally, the thickness of the gate 106 is between about 300 angstroms and about 3000 angstroms and the thickness of the gate dielectric 108 is between about 15 angstroms and about 50 angstroms. However, larger or smaller thicknesses of the gate 106 and the gate dielectric 108 may be appropriate depending on the design specifications of the active device 104.

The spacer 112 can be made from dielectric materials such as an oxide, a nitride, or a combination thereof (e.g., a multi-layer structure), but preferably includes silicon dioxide. The spacer 112 can be formed by a variety of techniques, including, but not limited to, chemical vapor deposition, physical vapor deposition and thermal oxidation.

In some embodiments, the spacer 112 can be formed by oxidation of the gate 106 material, followed by removal of the oxide from over the substrate 102, thereby forming the spacer 112. However, it is to be understood that the type of materials and method chosen for the formation of the spacer 112 is not limited to the above examples and may include any material and method that permits the formation of a gate sidewall structure that electrically isolates the gate 106.

Generally, the spacer 112 may include a thickness ranging from about 20 angstroms to about 200 angstroms. However, it is to be understood that the thickness of the spacer 112 may vary with the design specifications of the active device 104. For example, the thickness of the spacer 112 may vary with the desired placement of the electrical contact 122 over the source 116 and its resultant proximity effects upon the channel 110 of the active device 104.

It will be appreciated by those skilled in the art that the electrical contact 122 can affect the mobility of carriers within the channel 110 of the active device 104. For example, in some embodiments, if the electrical contact 122 is placed close to the channel 110, the electrical contact 122 can positively or negatively affect the mobility of carriers within the channel 110. Accordingly, it is to be understood that the thickness of the spacer 112 can be modulated (e.g., by increasing or decreasing the thickness) to reduce or increase the effect that the electrical contact 122 can have on carrier mobility within the channel 110.

The drift region 114 can be formed within the substrate 102 and spaced apart from the source 116. The drift region 114 may include a doped region with either p-type doping or n-type doping, depending upon the design specifications of the integrated circuit system 100. By way of example, the drift region 114 can be formed by a single or multi-step ion implantation process, a single or multi-step diffusion technique, or a combination thereof. Generally, the drift region 114 can be lightly doped with a dopant from about $5.0 \times 10^{11}$ to about $5.0 \times 10^{13}$ atoms/cm$^2$. However, larger or smaller doping amounts for the drift region 114 may be appropriate depending on the design specifications of the integrated circuit system 100. Moreover, it will be appreciated by those skilled in the art that the drift region 114 may also include retro-grade dopant profiles.

Generally, the drift region 114 is bounded in part on one side by the top surface 118 of the substrate 102. In some embodiments, the drift region 114 may also be formed to a depth within the substrate 102 that exceeds the depth of the isolation structure 124, while overlapping a portion of the gate 106.

The source 116 can be formed within the substrate 102 and spaced apart from the drift region 114. The source 116 may include a doped region with either p-type doping or n-type doping, depending upon the design specifications of the integrated circuit system 100. By way of example, the source 116 can be formed by single or multi-step ion implantation process steps, single or multi-step diffusion techniques, or a combination thereof. Generally, the source 116 can be heavily doped with a dopant from about $1.0 \times 10^{14}$ to about $1.0 \times 10^{16}$ atoms/cm$^2$. However, larger or smaller doping amounts for the source 116 may be appropriate depending on the design specifications of the integrated circuit system 100. Moreover, it will be appreciated by those skilled in the art that the source 116 may also include retro-grade dopant profiles.

Generally, the source 116 is bounded in part on one side by the top surface 118 of the substrate 102. In some embodiments, the source 116 may also be formed to a depth within the substrate 102 that is less than the depth of the isolation structure 124, while overlapping a portion of the gate 106.

The drain 120 may include a doped region with either p-type doping or n-type doping, depending upon the design specifications of the integrated circuit system 100. By way of example, the drain 120 can be formed by single or multi-step growth techniques, single or multi-step deposition techniques, or a combination thereof. Generally, the drain 120 can be heavily doped with a dopant from about $1.0 \times 10^{14}$ to about $1.0 \times 10^{16}$ atoms/cm$^2$. However, larger or smaller doping amounts for the drain 120 may be appropriate depending on the design specifications of the integrated circuit system 100. Moreover, it will be appreciated by those skilled in the art that the drain 120 may also include retro-grade dopant profiles.

Generally, the drain 120 can be formed above the substrate 102, thereby forming an elevated drain on the substrate 102. In such cases, the drain 120 is not formed within the substrate 102, which allows the drift region 114 to occupy a portion of the substrate 102 traditionally used for a drain region by previous LDMOS structure methodologies. By forming the drain 120 directly on the drift region 114 and completely above the top surface 118 of the substrate 102, the drift region 114 may occupy a larger volume including the top surface 118 of the substrate 102 without consuming additional device surface area (i.e., the dimensions of the drift region 114 do not need to be increased to reduce problematic substrate currents). Notably, the present inventors have discovered that the elevated drain system and method of the present embodiments produces a device with substrate currents ($I_{submax}$) that are reduced by about one order of magnitude when compared to traditional similar dimensioned LDMOS structures, which form the drain region in the substrate 102. For example, traditional LDMOS structures exhibit an $I_{submax}$ of about 25 micro-ampere/micro-meter, while the elevated drain system and method of the present embodiments produces an $I_{submax}$ of about 3.8 micro-ampere/micro-meter.

The present inventors have also discovered that the elevated drain system and method of the present embodiments produces a device with substantially similar threshold voltage ($V_t$) characteristics, drive current ($I_{dsat}$) characteristics, and device breakdown voltage (BVDSS) characteristics as a traditional similar dimensioned LDMOS structure.

The elevated drain system and method of the present embodiments displaces the drain 120 vertically above the drift region 114, thereby allowing the drift region 114 to increase its volume by occupying the volume previously occupied by a traditional LDMOS drain. Accordingly, the system and method of the present embodiments helps to reduce the active device 104 pitch because the drift region 114 will not need to be made longer/wider to reduce the substrate 102 current. In at least one embodiment, it has been discovered by the present inventors that the elevated drain system and method of the present embodiments can provide about a twenty (20) percent reduction in pitch over that of a traditional LDMOS device configuration.

Moreover, it will be appreciated by those skilled in the art that the elevated drain system and method of the present embodiments can improve the safe operation region margin (e.g., in terms of device breakdown and reliability) due to lower substrate currents and lower parasitic capacitances. For example, by relocating and optimizing the placement of the drain 120 (e.g., above the substrate 102), this highly doped region can be moved further away from substrate 102, so that junction breakdown voltage is not degraded. As such, the parasitic capacitance is also lowered because of the elevated nature of the drain 120 helping to eliminate junction capacitance and/or due to the reduced junction area between the drift region 114 and the substrate 102. Additionally, by way of example, the hot carrier injection of a device formed by the elevated drain system and method of the present embodiments can also be much improved due to the reduced substrate current.

Furthermore, the on state resistance (Ron) of the active device 104 may also be reduced by lowering the resistance of the drift region 114. By way of example, the resistance of the drift region 114 can be lowered by utilizing the elevated drain system and method of the present embodiments, which reduce the size of the space within the substrate 102 required by the drift region 114.

The electrical contact 122, which may include a low resistance silicide or salicide electrical contact, can be formed over the gate 106, the source 116, and/or the drain 120. In some embodiments, the electrical contact 122 may include any conducting compound that forms an electrical interface between itself and another material that is thermally stable and provides uniform electrical properties with low resistance. In other embodiments, the electrical contact 122 may include refractory metal materials such as, tantalum (Ta), cobalt (Co), titanium (Ti), tungsten (W), platinum (Pt), or molybdenum (Mo). In yet other embodiments, the electrical contact 122 formed over a portion of the source 116 can be aligned to the spacer 112 via a salicide process.

It is to be understood that the integrated circuit system 100 may undergo a cleaning step to remove surface contaminants, such as particles, mobile ionic contaminants, organics and native oxides, before formation of the electrical contact 122.

The isolation structure 124, which may include a shallow trench isolation structure, a local oxidation of silicon structure, and/or other suitable isolation features, can electrically isolate and/or separate the active device 104 from other structures. Generally, the isolation structure 124 may include a first isolation structure, a second isolation structure, and a third isolation structure. By way of example, the first isolation structure can be spaced apart from the second isolation structure and the third isolation structure can be formed between the first isolation structure and the second isolation structure. The third isolation structure can also be spaced apart from the first isolation structure and the second isolation structure.

In some embodiments, the isolation structure 124 can be made from a dielectric material such as silicon oxide, silicon nitride, or silicon oxynitride. In other embodiments, the isolation structure 124 may also include a multi-layer structure of one or more dielectric materials.

Figure 2:
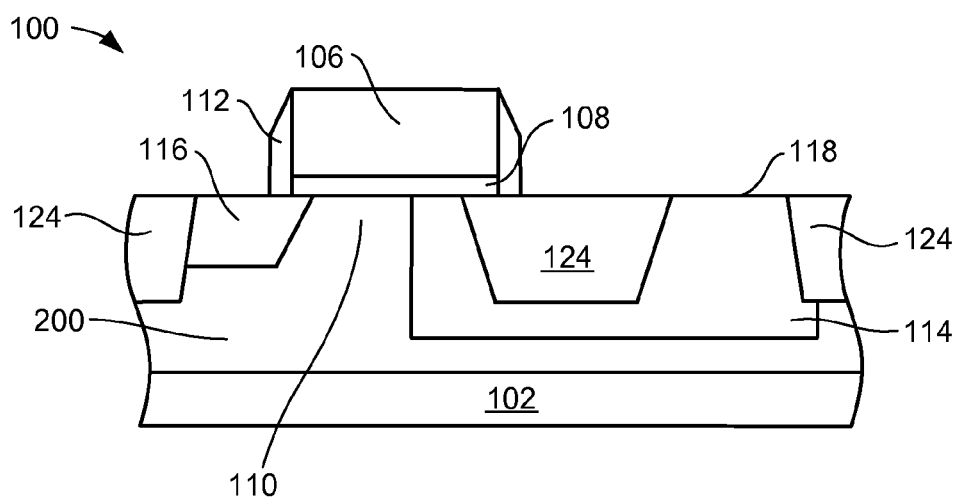
FIG. 2 is a partial cross sectional view of an integrated circuit system in an initial stage of manufacture in accordance with an embodiment of the present invention.

Referring now to FIG. 2, therein is shown a partial cross sectional view of the integrated circuit system 100 in an initial stage of manufacture in accordance with an embodiment of the present invention. The present embodiment will be described herein in the context of an NMOS device, but it will be appreciated by those skilled in the art that a PMOS device could be formed by simply substituting opposite polarities to those given for the NMOS embodiments, and that the techniques and aspects of the present embodiments will similarly apply to the alternative embodiment.

In one embodiment, the substrate 102 may include a p-type substrate doped with a p-type impurity, such as boron, for example. The substrate 102 may also include a lightly doped region 200 with a p-type impurity dopant between about $5 \times 10^{12}$ to about $5 \times 10^{13}$ atoms/cm$^2$, a lightly doped form of the drift region 114 with an n-type impurity dopant between about $5 \times 10^{11}$ to about $5 \times 10^{13}$ atoms/cm$^2$, and a heavily doped form of the source 116 with an n-type impurity dopant between about $1 \times 10^{14}$ to about $1 \times 10^{16}$ atoms/cm$^2$. However, it will be appreciated by those skilled in the art that larger or smaller doping concentrations of the lightly doped region 200, the lightly doped form of the drift region 114, and/or the heavily doped form of the source 116 may be appropriate depending on the design specifications of the integrated circuit system 100.

Per this embodiment, the source 116 and the drift region 114 can be formed to overlap at least a portion of the gate 106, while remaining spaced apart from each other. The drift region 114 may also be formed to envelope at least one of the isolation structure 124 formed between the channel 110 and the drain 120 (not shown). However, it will be appreciated by those skilled in the art that larger or smaller depths of the drift region 114 may be appropriate depending on the design specifications of the integrated circuit system 100. Moreover, the drift region 114 can be formed such that at least one side of the drift region 114 is bounded in part by the top surface 118 of the substrate 102, where the drift region 114 will interface (i.e., the top surface 118 of the substrate 102) with the drain 120.

Subsequent to forming the source 116 and the drift region 114, an anneal step can be performed to electrically activate the dopants within the substrate 102 and/or repair crystalline damage. It is to be understood that the anneal step may include any thermal process that electrically activates the dopants or repairs crystalline damage within the substrate 102, such as a rapid thermal anneal, a spike anneal and/or a laser anneal.

It will be appreciated by those skilled in the art that the gate 106, the gate dielectric 108, and the spacer 112 can be formed by conventional deposition, patterning, photolithography, and etching techniques known in the semiconductor processing industry for the manufacture of active devices before or after forming the drift region 114, the source 116, the isolation structure, and/or the lightly doped region 200.

Figure 3:
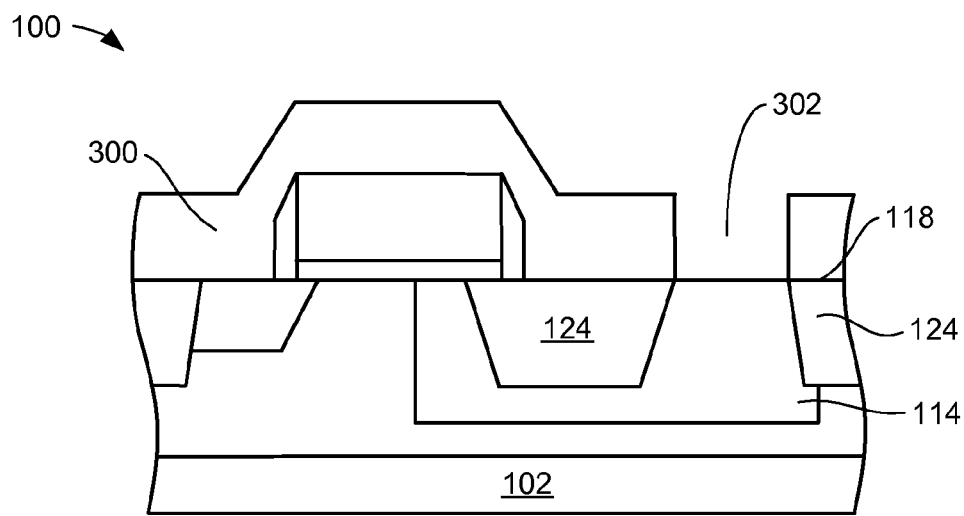
FIG. 3 is the structure of FIG. 2 after forming a mask layer.

Referring now to FIG. 3, therein is shown the structure of FIG. 2 after forming a mask layer 300. Generally, the mask layer 300 can be formed over the entirety or on selected portions of the integrated circuit system 100.

In some embodiments, the mask layer 300 can be a positive or negative photoresist material that is patterned to form an opening 302. In such cases, the mask layer 300 can be deposited and patterned by using materials and techniques well known within the semiconductor processing arts. Generally, the thickness of the mask layer 300 can vary between about 200 nanometers and about 2000 nanometers. However, larger or smaller thicknesses of the mask layer 300 may be appropriate depending on the design specifications of the integrated circuit system 100.

It will be appreciated by those skilled in the art that the thickness range for the mask layer 300 is compatible with sub 65 nanometer technology where the lateral and vertical geometries of the integrated circuit system 100 are greatly reduced. The present inventors have discovered that by maintaining the mask layer 300 thickness below about 2000 nanometers that critical dimension control of sub 65 nanometers devices can be improved.

In other embodiments, the mask layer 300 may include one or more layers, wherein at least one of the layers includes an anti-reflective layer, such as an organic or an inorganic dielectric material that can suppress unintended energy/light reflection from underlying layers. In such cases, the mask layer 300 may include a bottom anti-reflective coating (BARC), for example, that is proximate the top surface 118 of the substrate 102. Generally, the BARC may include one or more thin film layers of different material applied in a selected sequence.

It will be appreciated by those skilled in the art that the application of a BARC can improve the sidewall angle (e.g., create a vertical sidewall) of the opening 302 within the mask layer 300, thereby improving critical dimension control.

In other embodiments, the mask layer 300 may also include a release layer or a primer formed between the top surface 118 and the remainder of the mask layer 300, to facilitate removal.

In yet other embodiments, the mask layer 300 may include one or more layers, wherein at least one of the layers includes an anti-reflective layer that can suppress unintended energy/light reflection from underlying layers. In such cases, the mask layer 300 may include a top anti-reflective coating (TARC) that acts as a transparent thin-film interface layer, which uses destructive interference between light rays to eliminate reflectance. Generally, the TARC may include one or more thin film layers of different material applied in a selected sequence.

It will be appreciated by those skilled in the art that the application of the TARC can improve the sidewall angle (e.g., create a vertical sidewall) of the opening 302 within the mask layer 300, thereby improving critical dimension control.

In yet other embodiments, the mask layer 300 may include a material that exhibits a high etch selectivity with regards to the material of the substrate 102, while blocking the selective epitaxial growth of silicon in areas left covered by the mask layer 300.

Generally, each of the opening 302 are to be formed in an area over the substrate 102 where the drift region 114 is located. In one embodiment, each of the opening 302 can be formed in an area over the drift region 114 that is bounded in part by two of the isolation structure 124 and the top surface 118 of the substrate 102. In either case, portions of the mask layer 300 can be removed from over the drift region 114 by employing single step or multi-step etch methods selective to the composition of the mask layer 300. For example, the mask layer 300 can be etched by common wet or dry etch chemistries. However, it is to be understood that the type of etch chemistry used to etch the mask layer 300 is not essential, what is important is that the mask layer 300 is removed from over at least a portion of the drift region 114, while remaining portions of the integrated circuit system 100 remain covered by the mask layer 300, thereby protecting the substrate 102 from a subsequent deposition step.

In some embodiments, the exposed portion of the substrate 102 (e.g., the portion above the drift region 114) may undergo a cleaning step to remove surface contaminants, such as particles, mobile ionic contaminants, organics and native oxides, before further processing.

Figure 4:
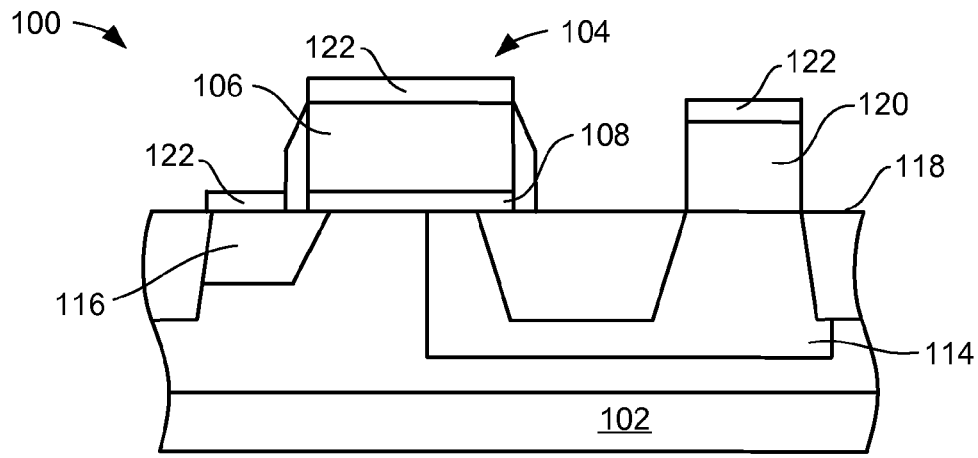
FIG. 4 is the structure of FIG. 3 after formation of a drain region.

Referring now to FIG. 4, therein is shown the structure of FIG. 3 after formation of the drain 120. The drain 120 can be formed over or on the drift region 114, thereby enabling the drift region 114 to occupy the space within the substrate 102 previously occupied by a traditional LDMOS drain formation.

Generally, the drain 120 can be made from any type of material that can be epitaxially grown (e.g., via a selective epitaxial growth process) over the substrate 102, while permitting electrical conductivity. By way of example, in some embodiments, the exposed portion of the substrate 102 within the opening 302, of FIG. 3, can be subjected to one or more impurities during the epitaxial growth process such that the drain 120 may be formed as an n-type structure, wherein n-type impurities are used for NMOS devices and p-type impurities are used for PMOS devices. In other embodiments, the drain 120 may not be doped during the epitaxial growth process, but can be subsequently doped by an implantation or diffusion of impurities.

As an exemplary illustration, the drain 120 can be made from an epitaxial n-type doped silicon (Si) or an epitaxial n-type doped silicon germanium (SiGe), wherein the n-type dopant is selected from Group V of the Periodic Table of Elements. In such cases, the drain 120 may employ a heavily doped phosphorus (P) silicon-germanium layer or a heavily doped phosphorus silicon layer with a doping of phosphorus between about $1 \times 10^{14}$ (atoms/$cm^3$) to about $1 \times 10^{16}$ (atoms/$cm^2$). As an exemplary illustration, the drain 120 can be grown via an in-situ phosphorus doped selective epitaxial growth method that forms an elevated drain above the drift region 114 and on the top surface 118 of the substrate 102 (i.e., within the opening 302 of FIG. 3).

Generally, the drain 120 can be deposited by an epitaxial process utilizing a silicon source, such as silane, dichlorosilane ($SiH_2Cl_2$), trichlorosilane (TCS), or silicon tetrachloride ($SiCl_4$), at a temperature between approximately 500° C. and approximately 1000° C. However it is to be understood that the drain 120 is not to be limited to any particular type of material, dopant, dopant concentration, or deposition parameter. In accordance with the present embodiment, the drain 120 may include any material, dopant, dopant concentration, or deposition parameter that is strategically engineered and designed to permit the formation of an epitaxial layer exhibiting the characteristics of electrical conduction.

Generally, the drain 120 can be deposited with a thickness substantially similar to the combined thickness of the gate 106 and the gate dielectric 108, thereby making these structures substantially co-planar. Such a configuration may ease the process manufacturing requirements for the integrated circuit system 100. However, it is to be understood that the thickness of the drain 120 deposited may include any thickness that permits electrical conductivity without detrimental breakdown during operation of the active device 104.

It will be appreciated by those skilled in the art that by employing an epitaxial process for depositing the drain 120, the drain 120 may obtain a crystalline structure that is substantially identical to the crystalline orientation of the substrate 102 (e.g.—a <100>, <110>, or <111> orientation). Moreover, it will be appreciated by those skilled in the art that by forming the drain 120 above the drift region 114, that the drift region 114 may now fully utilize the volume of the substrate 102 previously occupied by traditional LDMOS drain configurations, thereby lowering substrate current, parasitic capacitance, and on state resistance ($R_{on}$) within the active device 104.

It is to be understood that the selective epitaxy process of the present embodiments provides flexibility for the device designer to optimize performance of the integrated circuit system 100 by controlling epilayer doping, thickness, concentration, and profile of the drain 120, independent of the substrate 102.

It will be appreciated by those skilled in the art that the electrical contact 122 can be formed over the gate 106, the source 116, and the drain 120 using techniques and materials well known in the art. Moreover, it will be appreciated by those skilled in the art that conductive plugs and local/global interconnects can be formed over the integrated circuit system 100 as is well known in the art. Subsequent to forming these structures, the mask layer 300 (not shown) or other masking layers can be removed, if not already.

Figure 5:
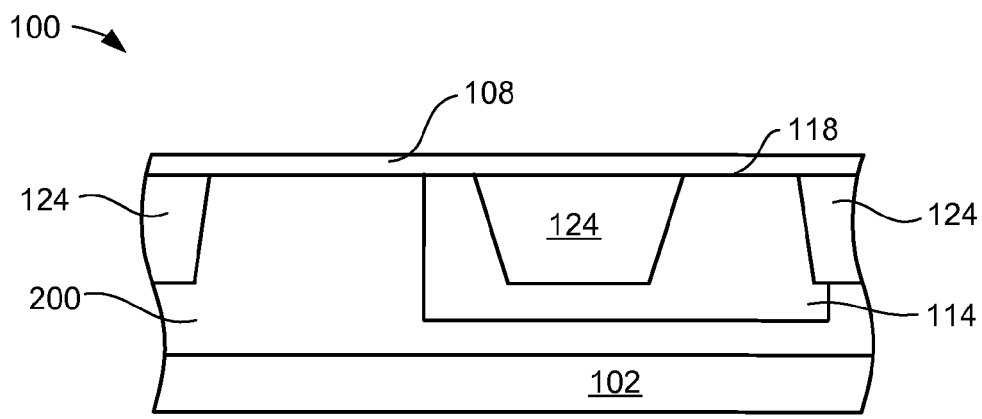
FIG. 5 is a partial cross sectional view of an integrated circuit system in an initial stage of manufacture in accordance with another embodiment of the present invention.
Figure 6:
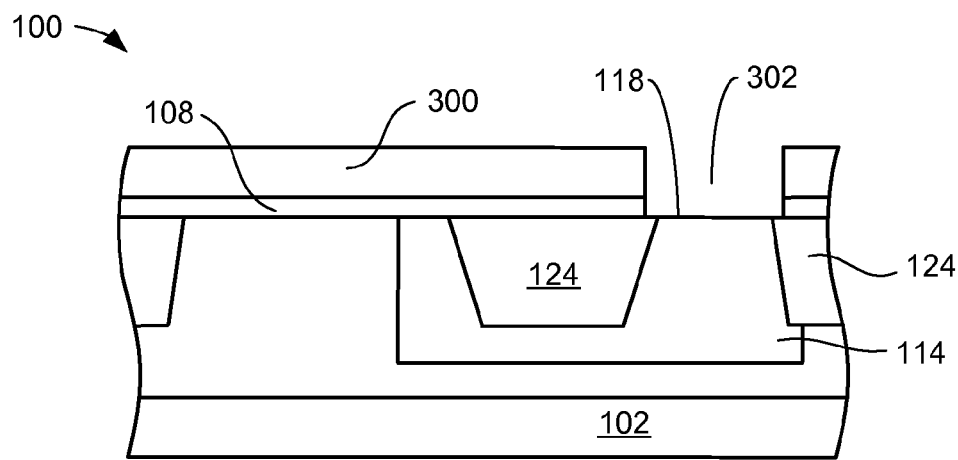
FIG. 6 is the structure of FIG. 5 after forming a mask layer.
Figure 7:
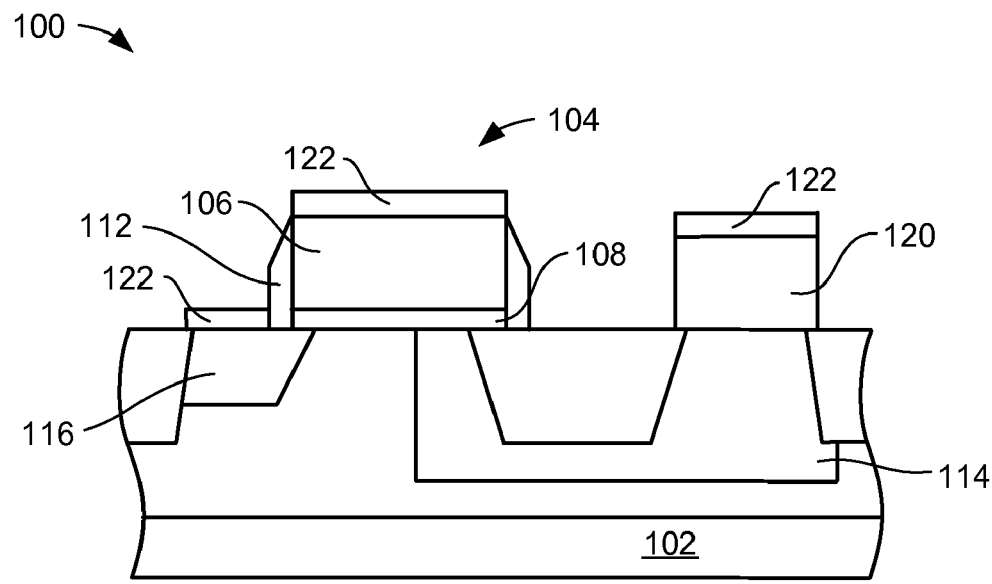
FIG. 7 is the structure of FIG. 6 after further processing.

Referring now to FIGS. 5-7. FIGS. 5-7 include some of the same reference numbers used to describe the integrated circuit system 100 in FIGS. 1-4 and the process steps of FIGS. 1-4. It is noted that the layers, structures, and process steps corresponding to such reference numbers generally include the same characteristics (e.g., composition, thickness, function, process techniques, etc.) as those described in reference to FIGS. 1-4 and, therefore, their descriptions are not reiterated in detail for FIGS. 5-7. Rather the descriptions of the layers, structures, and process steps corresponding to reference numbers in FIGS. 1-4 are incorporated for the same reference numbers included in FIGS. 5-7.

Referring now to FIG. 5, therein is shown a partial cross sectional view of the integrated circuit system 100 in an initial stage of manufacture in accordance with another embodiment of the present invention. The present embodiment will be described herein in the context of an NMOS device, but it will be appreciated by those skilled in the art that a PMOS device could be formed by simply substituting opposite polarities to those given for the NMOS embodiments, and that the techniques and aspects of the present embodiments will similarly apply to the alternative embodiment.

The integrated circuit system 100 may include the substrate 102, the gate dielectric 108, the drift region 114, the top surface 118, the isolation structure 124, and the lightly doped region 200. It is to be understood that the substrate 102, the gate dielectric 108, the drift region 114, the top surface 118, the isolation structure 124, and the lightly doped region 200 may include any of the characteristics, such as material composition, thickness, and process techniques, described above in regard to FIGS. 1-4.

The integrated circuit system 100, however, differs from the integrated circuit system 100, of FIG. 2, by not forming the gate 106, the spacer 112, and/or the source 116 at this stage of manufacture. In such cases, the local and global planarity of the integrated circuit system 100 can be improved over that of other techniques, thereby easing the process latitude constraints on the manufacturing process (e.g., the photolithography process) and enabling more products to meet the specified design requirements of the integrated circuit system 100.

Referring now to FIG. 6, therein is shown the structure of FIG. 5 after forming the mask layer 300. Generally, the mask layer 300 can be formed over the entirety or on selected portions of the integrated circuit system 100. It is to be understood that the mask layer 300 may include any of the characteristics, such as material composition, thickness, and process techniques, described above in regard to FIG. 3.

Generally, some of the opening 302 are to be formed in an area over the substrate 102 where the drift region 114 is located. In one embodiment, each of the opening 302 can be formed in an area over the drift region 114 that is bounded in part by two of the isolation structure 124 and the top surface 118 of the substrate 102. In either case, portions of the mask layer 300 and the gate dielectric 108 can be removed from over the drift region 114 by employing single step or multi-step etch methods selective to the composition of the mask layer 300 and the gate dielectric 108. Moreover, it will be appreciated by those skilled in the art that some over-etch of the opening 302 in the horizontal direction can be permitted due to the bounding in part of the drift region 114 by the isolation structure 124, thereby ensuring a reliable electrical interface between the drift region 114 and the drain 120 (not shown) to be subsequently formed.

Referring not to FIG. 7, therein is shown the structure of FIG. 6 after further processing. Generally, the drain 120 can be formed from any type of material that permits electrical conductivity without detrimental breakdown during operation of the active device 104. For example, in one embodiment, the drain 120 can be formed from a semiconducting material that has been doped to alter its electrical resistivity. In another embodiment, the drain 120 may include a heavily n-type doped semiconducting material. In another embodiment, the drain 120 may include a doped or undoped form of silicon, silicon-germanium, silicon-caride, or other like materials.

In yet another embodiment, the drain 120 can be formed from the same material as the gate 106 and doped accordingly. In such cases, it will be appreciated by those skilled in the art that the drain 120 and the gate 106 can be formed by a single deposition step or a multiple step deposition process.

However, it will be appreciated by those skilled in the art that the drain 120 can be formed from and by a variety of materials and methods and is only to be limited to the formation of a material that permits electrical conductivity without detrimental breakdown during operation of the active device 104. Accordingly, it is to be understood that the drain 120 can be formed by a variety of techniques, including, but not limited to, chemical vapor deposition and/or physical vapor deposition techniques.

Moreover, it will be appreciated by those skilled in the art that by forming the drain 120 above the drift region 114, that the drift region 114 may now fully utilize the volume of the substrate 102 previously occupied by traditional LDMOS drain configurations, thereby lowering substrate current, parasitic capacitance, and on state resistance (Ron) within the active device 104.

Furthermore, it is to be understood that the gate 106, the gate dielectric 108, and the spacer 112 can be formed by conventional deposition, patterning, photolithography, and etching techniques known in the semiconductor processing industry for the manufacture of active devices.

The source 116 can be formed before or after the gate 106. Details of the source 116 are discussed above in FIGS. 1 and 2. As exemplary illustrations, the source 116 can be formed before forming the gate 106 by implanting the source 116 through the gate dielectric 108 or the source 116 can be formed after forming the gate 106 by utilizing an angled implant to enhance the probability of overlap with the gate 106.

Moreover, it will be appreciated by those skilled in the art that the electrical contact 122 can be formed over the gate 106, the source 116, and the drain 120 using techniques and materials well known in the art. Furthermore, it will be appreciated by those skilled in the art that conductive plugs and local/global interconnects can be formed over the integrated circuit system 100 as is well known in the art. Subsequent to forming these structures, the mask layer 300 (not shown) or other masking layers can be removed, if not already.

Figure 8:
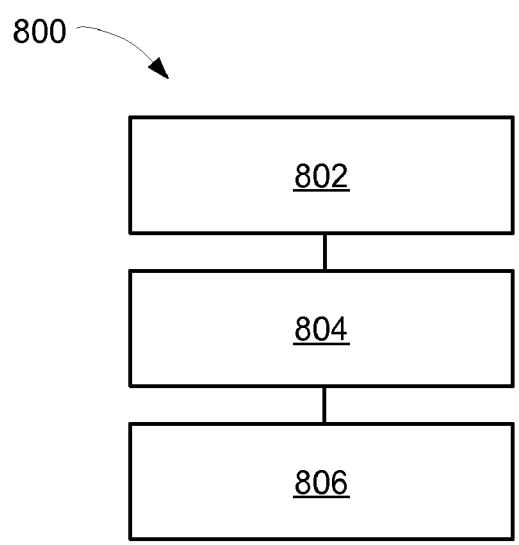
FIG. 8 a flow chart of an integrated circuit system for an integrated circuit system in accordance with an embodiment of the present invention.

Referring now to FIG. 8, therein is shown a flow chart of an integrated circuit system 800 for the integrated circuit system 100 in accordance with an embodiment of the present invention. The integrated circuit system 800 includes providing a substrate including an active device in a block 802; forming a drift region in the substrate, the drift region bounded in part by a top surface of the substrate and spaced apart from a source in a block 804; and forming a drain above the drift region in a block 806.

It has been discovered that the present invention thus has numerous aspects. One such aspect is that the present invention lowers substrate current within an active device by forming the drain above the drift region, thereby enabling the drift region to utilize a portion of the substrate previously occupied by a traditional LDMOS drain region.

Another aspect is that the present embodiments lower the parasitic capacitance of the active device by forming the drain above the drift region.

Another aspect is that the present embodiments lower the on-state resistance of the active device by forming the drain above the drift region.

Another aspect is that the present embodiments help to reduce the pitch between adjacent active devices by forming the drain above the drift region, thereby eliminating the need for a longer/wider drift region to lower the substrate current.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for improving substrate current, parasitic capacitance, on-state resistance, and/or device pitch. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
   providing a substrate including an active device;
   forming a drift region in the substrate, the drift region bounded in part by a top surface of the substrate and spaced apart from a source; and
   forming a drain directly on the drift region and not within the substrate wherein the drain is formed completely above the top surface of the substrate.

2. The method as claimed in claim 1 wherein:
   providing the active device includes providing an NMOS device.

3. The method as claimed in claim 1 wherein:
   forming the drain inlcudes an epitaxial growth process.

4. The method as claimed in claim 1 wherein:
   forming the drain inlcudes depositing a semiconducting material.

5. The method as claimed in claim 1 wherein:
   forming the drain above the drift region alters the substrate current, the parasitic capacitance, or the on-state resistance of the active device.

6. A method for manufacturing an integrated circuit system comprising:
   providing a substrate;
   forming a drift region in the substrate, the drift region bounded in part by a top surface of the substrate;
   forming a drain directly on the drift region and not within the substrate wherein the drain is formed completely above the top surface of the substrate;
   forming a source in the substrate and spaced apart from the drift region;
   forming a gate dielectric, a gate, and a spacer above the substrate; and
   forming an electrical contact.

7. The method as claimed in claim 6 wherein:
   forming the drain and the gate includes forming each structure to be substantially coplanar with the other.

8. The method as claimed in claim 6 wherein:
   forming the drain above the drift region includes forming the drain on the substrate.

9. The method as claimed in claim 6 wherein:
   forming the gate includes overlapping a portion of the source and the drift region with the gate.

10. The method as claimed in claim 6 wherein:
    forming the electrical contact includes one of the electrical contact formed over the source and aligned to the spacer.

11. An integrated circuit system comprising:
    a substrate including an active device;
    a drift region in the substrate, the drift region bounded in part by a top surface of the substrate and spaced apart from a source; and
    a drain directly on the drift region and not within the substrate wherein the drain is formed completely above the top surface of the substrate.

12. The system as claimed in claim 11 wherein:
    the active device includes an NMOS device.

13. The system as claimed in claim 11 wherein:
    the drain inlcudes an epitaxial material.

14. The system as claimed in claim 11 wherein:
    the drain inlcudes a semiconducting material.

15. The system as claimed in claim 11 wherein:
    the location of the drain above the drift region alters the substrate current, the parasitic capacitance, or the on-state resistance of the active device.

16. The system as claimed in claim 11 wherein:
    the substrate includes a lightly doped region.

17. The system as claimed in claim 11 wherein:
    the drain and the gate are substantially coplanar with each other.

18. The system as claimed in claim 11 wherein:
    the drain is on the substrate.

19. The system as claimed in claim 11 further comprising:
    a gate of the active device that overlaps a portion of the source and the drift region.

20. The system as claimed in claim 11 further comprising:
    an electrical contact over the source and aligned to a spacer.

* * * * *